US007583122B2

(12) United States Patent
Ronchi et al.

(10) Patent No.: US 7,583,122 B2
(45) Date of Patent: Sep. 1, 2009

(54) RECEIVER OF DIGITAL SIGNALS HAVING A VARIABLE HYSTERESIS, IN PARTICULAR FOR AUDIO DIGITAL APPLICATION

(75) Inventors: Marco Ronchi, Cavenago Brianza (IT); Marco Angelici, Galliante Lombardo (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 873 days.

(21) Appl. No.: 10/749,127

(22) Filed: Dec. 30, 2003

(65) Prior Publication Data

US 2004/0174198 A1    Sep. 9, 2004

(30) Foreign Application Priority Data

Dec. 30, 2002   (EP)   ................... 02425804

(51) Int. Cl.
*H03K 3/00* (2006.01)
(52) U.S. Cl. ............................ 327/205; 327/53; 327/54; 327/66; 327/206
(58) Field of Classification Search ................. 327/205, 327/206, 52–89, 96, 127, 246, 266, 274, 327/280, 287, 359, 560–563
See application file for complete search history.

(56) References Cited

U.S. PATENT DOCUMENTS 4,672,236 A * 6/1987 Toda et al. .................. 327/101

| | | | | |
|---|---|---|---|---|
| 6,229,350 B1 * | 5/2001 | Ricon-Mora | ................. | 327/777 |
| 6,269,388 B1 * | 7/2001 | Pioppo | ........................ | 708/852 |
| 6,801,761 B2 * | 10/2004 | Khorram | ..................... | 455/326 |

OTHER PUBLICATIONS http://en.wikipedia.org/wiki/Op_amp.*
www.ee.nmt.edu/~thomas/ee321/op-amp-ex-pos.html.*
http://www.uoguelph.ca/~antoon/gadgets/741/741.html.*
http://en.wikipedia.org/wiki/Computer.*
Operational Amplifiers http;//www.uoguelph.ca/~antoon/gadgets/741/741.html.*

* cited by examiner

*Primary Examiner*—Lincoln Donovan
*Assistant Examiner*—Brandon S Cole
(74) *Attorney, Agent, or Firm*—Lisa K. Jorgenson; Paul F. Rusyn; Graybeal Jackson LLP

(57) ABSTRACT

Embodiments of the invention relate to a signal receiver inserted between a first and a second voltage reference and having a first and a second input terminal effective to receive differential signals and an output terminal effective to provide a converted signal.

Advantageously, the signal receiver according to embodiments of the invention comprises a conversion stage inserted between the first and second voltage references and connected between the first and second input terminals of the signal receiver and an input terminal of an hysteresis comparator, connected in turn to the output terminal of the signal receiver. In particular, the conversion stage performs a conversion from any input signal received on respective input terminals to an intermediate signal provided on an output terminal and suitable for reception by the hysteresis comparator.

26 Claims, 5 Drawing Sheets

ARTE NOTA

ARTE NOTA

ARTE NOTA

ARTE NOTA

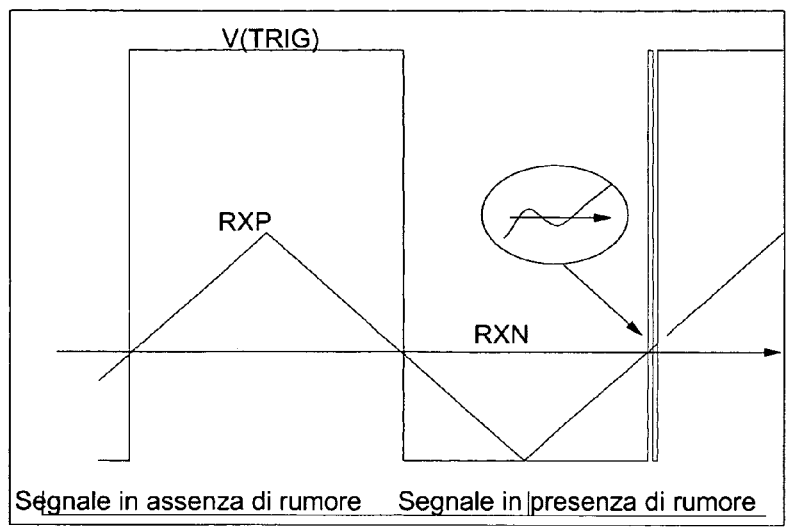
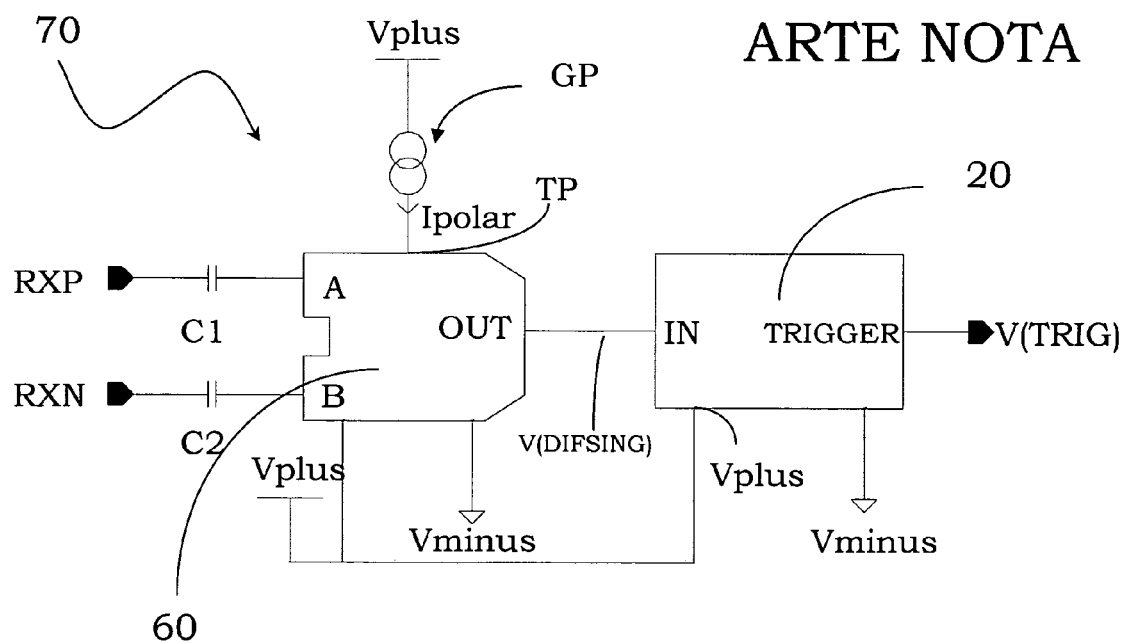
FIG. 5
ARTE NOTA
FIG. 7

RECEIVER OF DIGITAL SIGNALS HAVING A VARIABLE HYSTERESIS, IN PARTICULAR FOR AUDIO DIGITAL APPLICATION

PRIORITY CLAIM

This application claims priority from European patent application No. 02425804.8, filed Dec. 30, 2002, which is incorporated herein by reference.

TECHNICAL FIELD

Embodiments of the present invention relate to a receiver of digital signals originated from very different sources.

In particular, the receiver according to an embodiment of the invention is capable of supporting input signals of the single-ended type (for consumer applications) or of the differential type (for professional applications), with extremely variable voltage ranges (even higher than a supply voltage) and possibly affected by noises, generally indicated in the following description as ALL-INPUT signals.

More specifically, an embodiment of the invention relates to a receiver of ALL-INPUT signals comprising a conversion stage of the ALL-INPUT/single-ended type inserted between a supply voltage reference and a ground and having a first and a second input terminal effective to receive digital signals, an output terminal effective to provide an analog signal and a bias terminal effective to receive a bias current, as well as an hysteresis comparator.

Embodiments of the invention relate particularly, but not exclusively, to a receiver of digital audio signals and the following description is made with reference to this field of application for convenience of illustration only.

BACKGROUND

As it is well known, in the field of digital audio applications, data affected by noise originated from an optical fibre (POF) or a coaxial cable must be reconstructed. Data can be single-end or differential. To this purpose it is possible to use hysteresis comparators or Schmitt triggers, well known in the prior art.

By way of example, FIG. 1 shows a single-end hysteresis comparator 10 essentially comprising a positive-feedback operational amplifier 11.

In particular, the operational amplifier 11 has an inverting input terminal (−) receiving an input voltage signal Vi and an output terminal being feedback-connected, by means of a resistor R2, to a non-inverting input terminal (+) and effective to provide an output voltage signal Vo.

The non-inverting input terminal (+) is also connected to a voltage reference −Vdd by means of a further resistor R1. A voltage value V+ is then provided to this non-inverting input terminal (+), being equal to:

$$V+ = \beta V_0 \quad (1)$$

being:

$V_0$ the voltage value on the output terminal of the operational amplifier 11; $\beta$ a feedback coefficient equal to $R_1/(R_1+R_2)$.

It is also possible to optimize such an hysteresis comparator by means of a MOS configuration, schematically shown in FIG. 2 and globally indicated with 20. In particular the hysteresis comparator 20 is inserted between a supply voltage reference Vplus and a ground Vminus and it comprises a single-ended-configured Schmitt trigger 21 being cascade-connected to a buffer 22 between an input terminal IN and an output terminal TRIGGER.

In particular, the Schmitt trigger 21 comprises:

a first pair of PMOS transistors, M13 and M14, inserted, in series to each other, between the supply voltage reference Vplus and an inner circuit node triggNEG and having the control terminals connected to each other and to the input terminal IN of the hysteresis comparator 20;

a second pair of NMOS transistors, M17 and M18, inserted, in series to each other, between the inner circuit node triggNEG and the ground Vminus and having the control terminals connected to each other and to the input terminal IN of the hysteresis comparator 20;

a further PMOS transistor M12 inserted between an intermediate node X21 between the transistors M13 and M14 of the first pair of PMOS transistors and the ground Vminus; and a further NMOS transistor M19 inserted between the supply voltage reference Vplus and an intermediate node X22 between the transistors M17 and M18 of the second pair of NMOS transistors.

Transistors M12 and M19 have respective control terminals connected to each other and to the inner circuit node triggNEG, as well as to the buffer 22.

In particular, the buffer 22 comprises a first M11 and a second M20 transistor, respectively of the PMOS and NMOS type, connected, in series to each other, between the supply voltage reference Vplus and the ground Vminus, and having the control terminals connected to the control terminals of the transistors M12 and M19 of the Schmitt trigger 21.

Finally, transistors M11 and M20 are connected to each other in correspondence of the output terminal TRIGGER of the hysteresis comparator 20.

The aim of known hysteresis comparators, whose transfer function is shown in FIG. 3, is essentially to avoid the comparison uncertainty when the input signal, with noise, crosses the switching threshold.

In particular, in the example shown in FIGS. 4 and 5, a input signal being monotonic at intervals is considered, to which a white noise having a predetermined variance is added. The additional white noise causes a repeated zero-crossing of the signal received by the hysteresis-free comparator generating a series of undesired switchings at the comparator output. These undesired switchings are removed by means of a traditional hysteresis comparator (as shown in FIGS. 1 and 2).

Moreover, although advantageous under several embodiments, known solutions have technological limitations penalizing the industry cost, for example not allowing the CMOS technology implementation thereof.

Moreover, as in the case of a traditional hysteresis comparator 20, it happens that, even though the comparator has good features in terms of speed, power consumption and noise rejection, it does not satisfy the following specifications generally required by the different applications:

it does not allow a signal with broad dynamics, for example from 200 mV to 10 Volts, to be directly interfaced by using a receiver implemented with a low supply voltage technology (<2.5V);

it is not compatible with the standards requiring different hysteresis values;

it does not reach a sufficiently high response speed with a reduced power consumption required by portable battery applications if an operational amplifier is used (such as for example in the configuration shown in FIG. 1);

it is not compatible with single-ended/differential input signals without performance lost.

The problems linked to the low supply voltages (traditionally <2.5V, but also 1.8V), as well as to the use of the devices in extremely variable voltage ranges, as well as with noise, are essentially unsolved.

In other words, the need for devices being capable of supporting ALL-INPUT signals, i.e. input signals of the single-ended type (for consumer applications) and of the differential type (for professional applications), is increasingly felt, with extremely variable voltage ranges (even higher than a supply voltage) and possibly affected by noises.

A technical problem underlying embodiments of the present invention is to provide an hysteresis comparator which can be integrated in low-cost technologies without external components, capable of reconstructing a datum originated from an ALL-INPUT signal in a "free" digital signal (and thus usable for example in DSP applications), having such structural and functional features as to overcome the limitations still affecting prior art devices.

SUMMARY

An idea underlying an embodiment of the present invention is to perform, before sending the signals to the hysteresis comparator, an ALL-INPUT/single-ended conversion.

Based on this idea the technical problem is solved according to one embodiment of the present invention by a receiver essentially comprising a converter from an ALL-INPUT signal to an intermediate signal, for example of the trapezoidal type, as well as a traditional hysteresis comparator (comprising for example a Schmitt trigger). Advantageously according to an embodiment of the invention, operating on the intermediate signal slope, together with the fixed comparison thresholds of the hysteresis comparator, the receiver operates as a variable-threshold hysteresis comparator.

More particularly, the technical problem is solved according to another embodiment of the present invention by a signal receiver inserted between a first and a second voltage reference and having a first and a second input terminal effective to receive differential signals and an output terminal effective to provide a converted signal, characterized in that it comprises a conversion stage inserted between said first and second voltage references and connected between said first and second input terminals of said signal receiver and an input terminal of an hysteresis comparator, connected in turn to said output terminal of said signal receiver, said conversion stage performing a conversion from any input signal received on respective input terminals to an intermediate signal provided on an output terminal and suitable for reception by said hysteresis comparator.

The features and advantages of the receiver according to embodiments of the invention will be apparent from the following description of embodiments thereof given by way of non-limiting example with reference to the attached drawings.

BRIEF DESCRIPTION OF THE DRAWINGS

FIG. 5 shows the evolution in time of the input and output signals of an hysteresis-free comparator with and without noise superimposed to the input;

FIG. 7 schematically shows a signal receiver according to an embodiment of the invention;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

A variable hysteresis receiver of digital signals, particularly for digital audio applications, is described hereafter, schematically illustrated in FIG. 7, globally indicated with 70. Advantageously according to an embodiment of the invention, the receiver 70 essentially comprises a conversion stage 60 from an ALL-INPUT signal to an intermediate signal, for example of the trapezoidal type, as well as a traditional hysteresis comparator 20.

The output of such a digital receiver 70 is then to be processed by a digital signal processor (DSP) or however by a general microprocessor.

Figure 6:
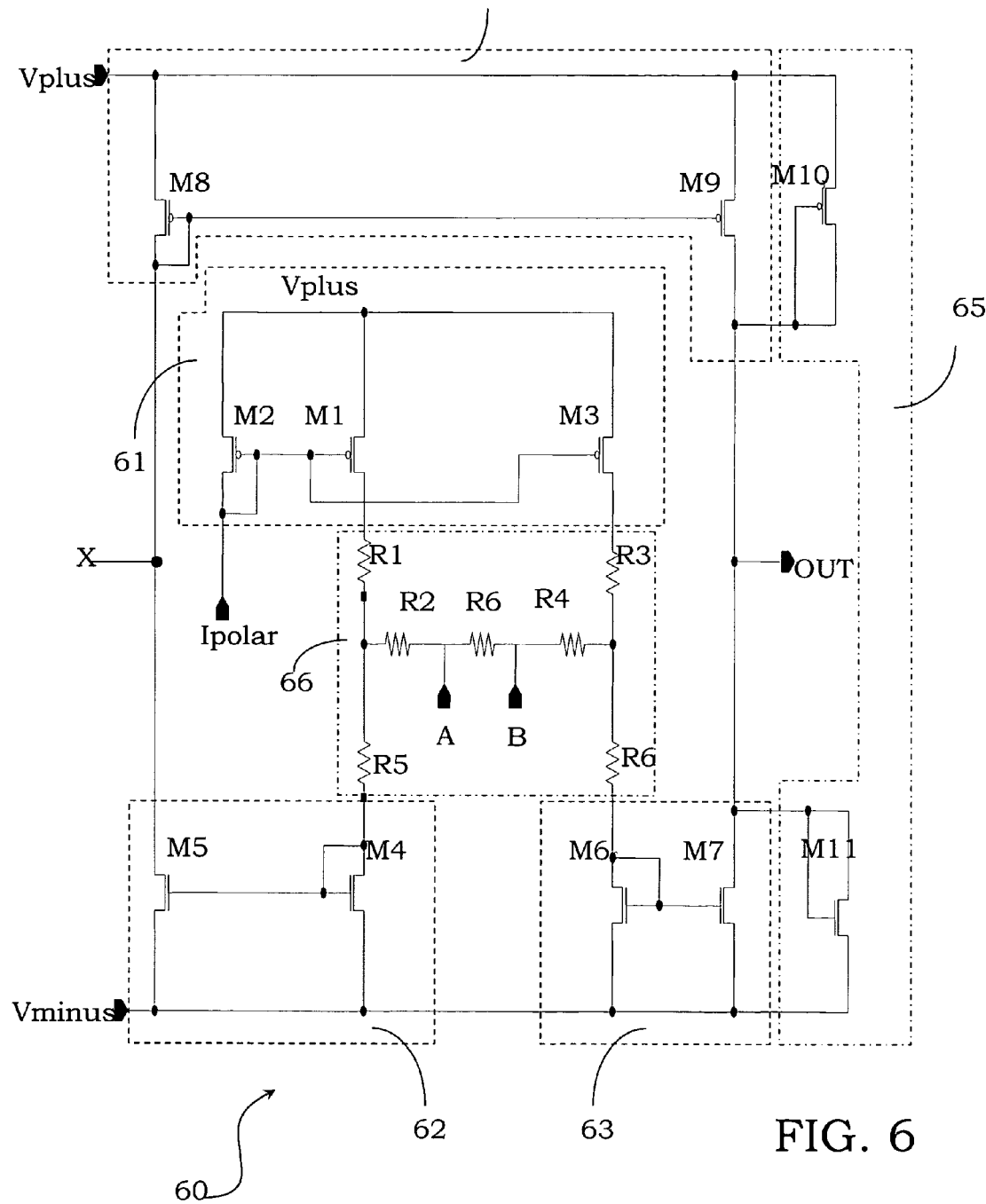
FIG. 6 schematically shows an ALL-INPUT/single-ended conversion stage according to an embodiment of the invention.

FIG. 6 shows an ALL-INPUT/single-ended conversion stage 60 according to an embodiment of the invention.

The conversion stage 60 is inserted between a first voltage reference, particularly a supply voltage reference Vplus, and a second voltage reference, particularly a ground Vminus, and it has essentially a current-mode structure formed by a plurality of current mirrors formed by means of MOS transistors. The conversion stage 60 has a pair of input terminals A and B, an output terminal OUT and a bias terminal TP receiving a bias current Ipolar.

In greater detail, the conversion stage 60 comprises a first current mirror 61 connected to the supply voltage reference Vplus and to the input terminals A and B, as well as to the bias terminal TP. The first current mirror 61 comprises a first M1, a second M2 and a third M3 P-channel MOS transistor.

The first transistor M1 is inserted between the supply voltage reference Vplus and the first input terminal A, to which it is connected by means of a first R1 and a second R2 resistor, and it has a control terminal connected to the control terminal of the second M2 and third M3 transistor.

The second diode-configured transistor M2 is inserted between the supply voltage reference Vplus and the bias terminal TP and it has a control terminal connected to the control terminal of the first transistor M1 and to the bias terminal TP.

The third transistor M3 is inserted between the supply voltage reference Vplus and the second input terminal B, to which it is connected by means of a third R3 and a fourth R4 resistor, and it has a control terminal connected to the control terminal of the first M1 and second M2 transistor.

The conversion stage 60 comprises also a second current mirror 62 connected to the ground Vminus and to the first input terminal A, as well as to a circuit node X. The second current mirror 62 comprises a fourth M4 and a fifth M5 N-channel MOS transistor.

In particular, the fourth diode-configured transistor M4 is inserted between the first input terminal A, to which it is connected by means of a fifth resistor R5 and the second resistor R2, and the ground Vminus and it has a control terminal connected to the control terminal of the fifth transistor M5.

The fifth transistor M5 is inserted between the circuit node X and the ground Vminus and it has a control terminal connected to the control terminal of the fourth transistor M4.

The conversion stage 60 further comprises a third current mirror 63 connected to the ground Vminus and to the second input terminal B, as well as to the output terminal OUT. The third current mirror 63 comprises a sixth M6 and a seventh M7 N-channel MOS transistor.

In particular, the sixth diode-configured transistor M6 is inserted between the second input terminal B, to which it is connected by means of a sixth resistor R6 and the fourth resistor R4, and the ground Vminus and it has a control terminal connected to the control terminal of the seventh transistor M7.

The seventh transistor M7 is inserted between the output terminal OUT and the ground Vminus and it has a control terminal connected to the control terminal of the sixth transistor M6.

The conversion stage 60 finally comprises a fourth current mirror 64 connected to the supply voltage reference Vplus, to the circuit node X, as well as to the output terminal OUT. The fourth current mirror 64 comprises an eighth M8 and a ninth M9 P-channel MOS transistor.

In particular, the eighth diode-configured transistor M8 is inserted between the supply voltage reference Vplus and the circuit node X and it has a control terminal connected to the control terminal of the ninth transistor M9.

The ninth transistor M9 is inserted between the supply voltage reference Vplus and the output terminal OUT and it has a control terminal connected to the control terminal of the eighth transistor M8.

The first A and second B input terminals are connected to each other by means of a further seventh resistor R7.

Finally, the conversion stage 60 comprises a current-voltage converter 65, inserted between the supply voltage reference Vplus and the ground Vminus and connected to the output terminal OUT of the conversion stage 60.

In particular, the current-voltage converter 65 comprises a tenth MOS transistor M10 inserted between the supply voltage reference Vplus and the output terminal OUT of the conversion stage 60, in parallel with the ninth transistor M9 comprised in the fourth current mirror 64, and having a control terminal connected to the output terminal OUT.

The current-voltage converter 65 also comprises an eleventh MOS transistor M11 inserted between the output terminal OUT and the ground Vminus, in parallel with the seventh transistor M7 comprised in the third current mirror 63 and having a control terminal connected to the output terminal OUT.

In the example shown, transistors M10 and M11 are P-channel and N-channel respectively.

It is worth noting that resistors R1, R2, R3, R4, R5, R6 and R7 form a resistive bridge 66 adjusting the impedance of the conversion stage 60 with the impedance of a possible coaxial cable connected to the input terminals A and B and it protects the transistors comprised in the stage 60 from an excessive overvoltage.

Advantageously according to an embodiment of the invention, it is possible to implement the conversion stage 60 in a low supply voltage technology (i.e. for supply voltage values being lower than 2.5V) and to interface it directly to a signal originated from a coaxial cable, whose dynamics can reach 10 volts for some standards.

The operation of the conversion stage 60 according to the described embodiment of the invention will now be described.

One feature consists in keeping the impedance detected at each node thereof at a value equal to 1/gm, succeeding therefore in being intrinsically fast also for low bias currents. The feedback lack makes the conversion stage 60 according to the described embodiment of the invention unconditionally stable when the bias current Ipolar varies. Traditionally all mirrors have a unitary multiplication factor except for mirrors 62 and 63 which can have a factor different from one, but equal for both, according to design specifications.

It is worth noting that this bias current Ipolar actually determines the stage gain and, in fact, the dynamics of the hysteresis voltage thereof.

Finally, the current-voltage converter 65 determines the stage 60 gain.

In fact, the input voltage RXP-RXN is converted into current in the resistive input network mirrored on the output stage 65 wherein it is converted again into voltage. The output/input gain is directly proportional to the resistance value detected at the output node of the stage 60, i.e. Rout=1/[Rds9//Rds7//(1/gm10)//(1/gm11)].

Figure 8:
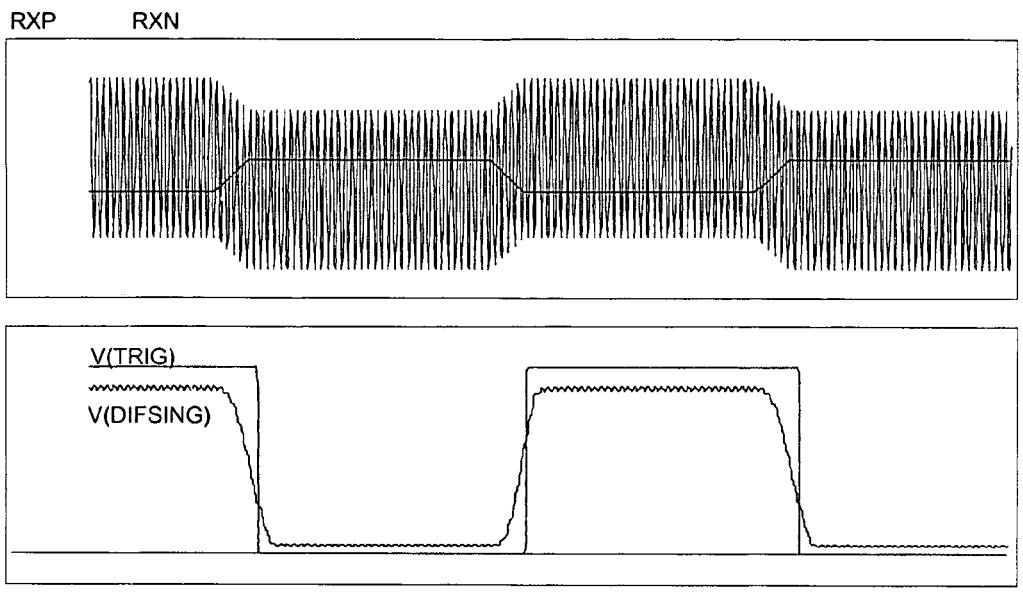
FIGS. 8 and 9 show the evolution in time of input (RXP, RXN) and intermediate output (VDIFSING) signals, as well as a final output signal (VTRIG) of the receiver of FIG. 7.
Figure 9:
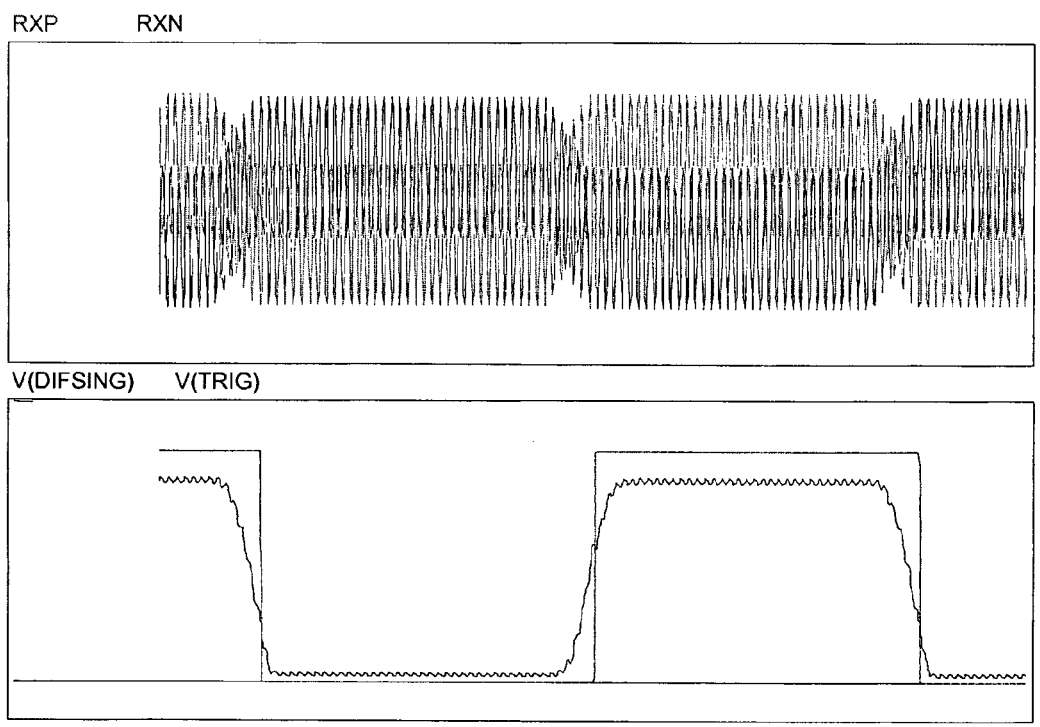

In practice, being Rds9 and Rds7>>1/gm10 and 1/gm 11, Rout is fixed at first approximation by the transconductance of MOS transistors M10 and M11. By varying these transconductances, it is thus possible to change the slope of the edges of the signal V(DIFSING), as shown in FIGS. 8 and 9, varying thus also the overall receiver hysteresis.

The output terminal OUT thus comprises a still analog converted signal of the single-end type V(DIFSING) capable of driving an inverting hysteresis comparator, such as the Schmitt trigger described with reference to the prior art and schematically shown in FIG. 2.

Moreover the input block of the stage 60, composed of the resistive network 66, the current IPOLAR and MOS transistors M1, M3, M4, M6, self-biases input nodes A and B at a reference voltage comprised between Vplus and Vminus, providing the greatest versatility of use, with any source (single-ended or differential).

A variable hysteresis receiver 70 of digital signals according to an embodiment of the invention, as schematically shown in FIG. 7, is thus obtained.

In particular, the hysteresis comparator 70 comprises a conversion stage 60 inserted between the supply voltage reference Vplus and the ground Vminus and having the bias terminal TP connected to a generator GP of the bias current Ipolar, as well as the output terminal OUT connected to the input terminal IN of an hysteresis comparator 20, in particular a Schmitt trigger, inserted in turn between the supply voltage reference Vplus and the ground Vminus and having an output terminal TRIGGER effective to provide a "free" output signal.

It must be remembered that the Schmitt trigger 20 has an hysteresis cycle equal to:

$$Vhys=(Vplus-Vminus)-(\Delta V_N-\Delta V_P) \quad (2)$$

Being:

Vhys the hysteresis voltage of the Schmitt trigger 20;

Vplus the positive supply voltage of the Schmitt trigger 20; and

Figure 1:
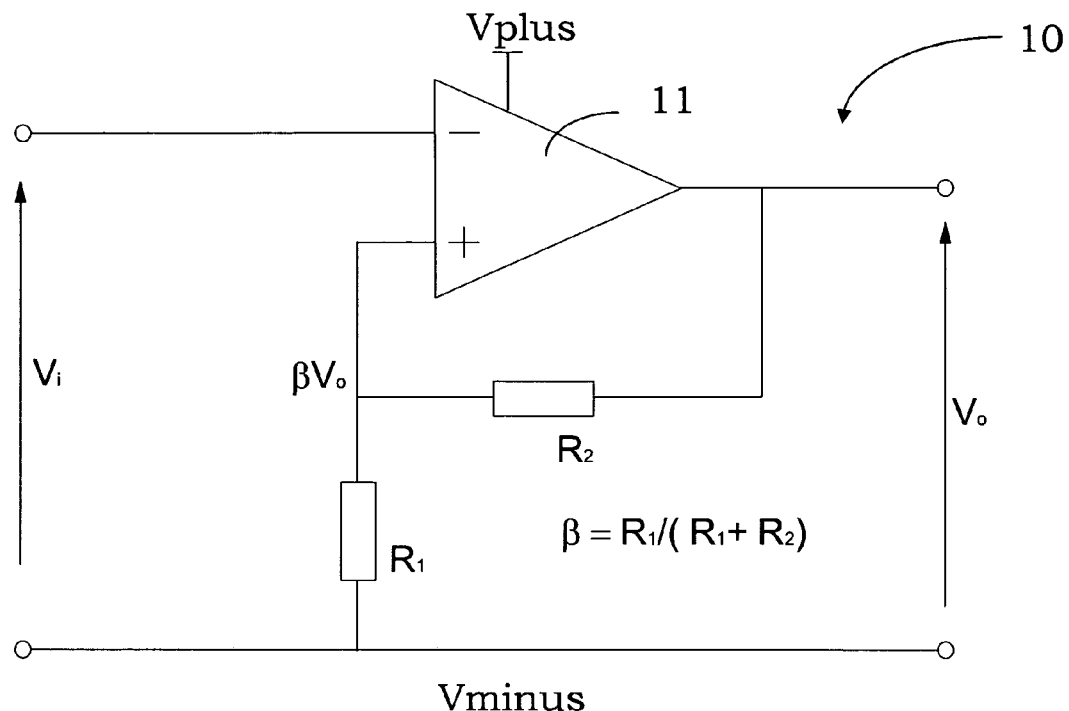
FIG. 1 schematically shows a prior art hysteresis comparator.
Figure 2:
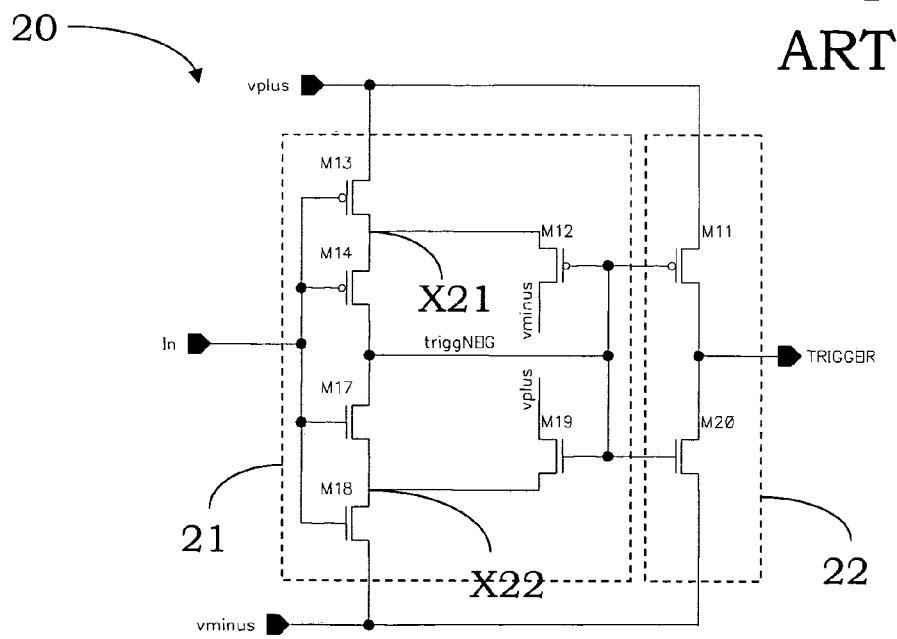
FIG. 2 schematically shows an alternative embodiment of a prior art hysteresis comparator.
Figure 3:
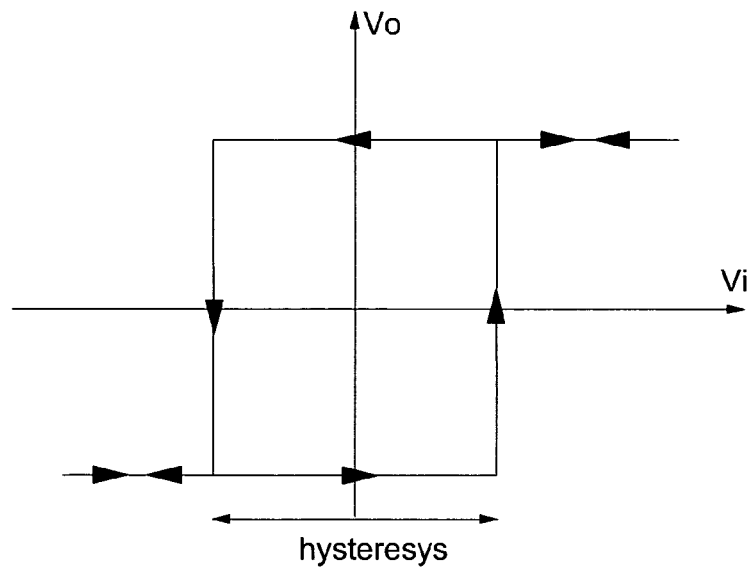
FIG. 3 shows the transfer function of a prior art hysteresis comparator.
Figure 4:
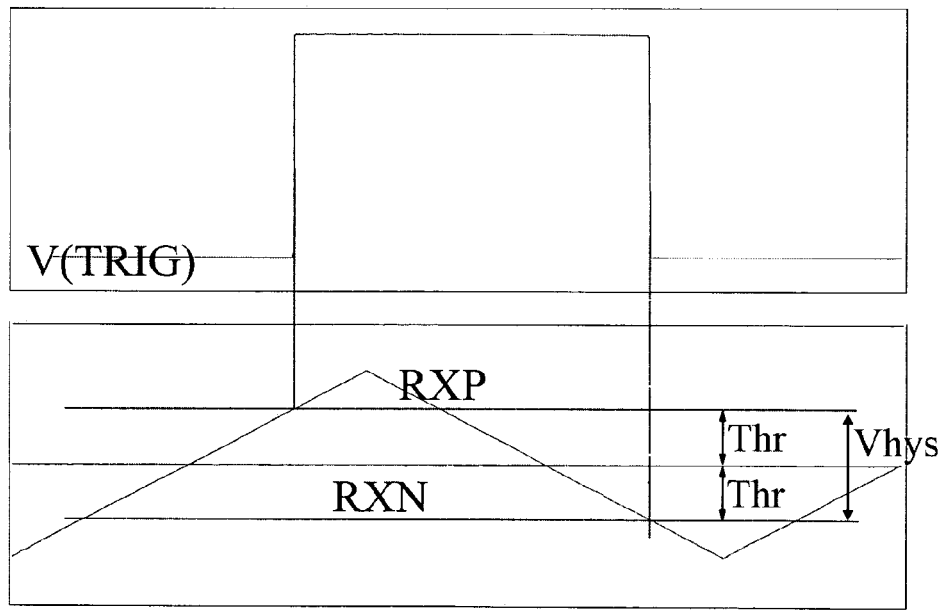
FIG. 4 shows the evolution in time of signals in a prior art hysteresis comparator.

Vminus the negative supply voltage of the Schmitt trigger 20 (traditionally the ground)

$$\Delta V_N = |Vth19 - Vth18| \quad (3)$$

$$\Delta V_P = |Vth12 - Vth13| \quad (4)$$

where Vth19, Vth18, Vth12 and Vth13 are the threshold voltages of transistors M19, M18, M12 and M13 respectively, comprised in the Schmitt trigger 20, as shown in FIG. 2.

It is thus possible to change the hysteresis voltage operating on the geometries of these transistors M18, M19, M12 and M13 comprised in the Schmitt trigger 20 in order to change the transistor threshold voltages Vth according to the relations (3) and (4) and thus to change the hysteresis voltage according to the relation (2).

In particular, the conversion stage 60 allows a differential single-ended converter to be manufactured, by means of a CMOS architecture, to be performed, wherein the geometries of the transistors used determine the hysteresis voltage for an allotted bias current. The conversion stage similarly allows the hysteresis voltage and the operating band to be dynamically changed in time when the bias current changes.

Advantageously according to the described embodiment of the invention, in order to limit the range of possibilities being theoretically obtainable, it is easy to set the hysteresis voltage by changing the geometries of the transistors M10 and M11 comprised in the current-voltage converter 65 of the conversion stage 60. It is also possible to set the hysteresis voltage by changing the bias current Ipolar.

The hysteresis comparator 70 obtained from the cascade-connected conversion stage 60 according to the described embodiment of the invention and Schmitt trigger 20 is thus more versatile and flexible than a prior art hysteresis comparator.

Advantageously according to the described embodiment of the invention, the hysteresis comparator 70 can be used as ALL-INPUT signal receiver.

If the input signal is differential (such as in professional audio applications) both input terminals RXP and RXN are connected to the source. For convenience of illustrations, the input terminals of the receiver 70 and the signal thereon will be indifferently indicated with RXP and RXN.

If the input signal is single-ended, it is sufficient to connect any of the two terminals RXP or RXN to the signal source, connecting the other terminal to ground.

Capacitances C1 and C2, respectively connected between the terminals RXP, RXN of the variable hysteresis receiver of digital signals 70 and the input terminals A, B of the stage 60, uncouple the receiver 70 from the source. The input of the stage 60 (A and B) self-biases itself to the correct bias voltage (as previously explained).

The operation of the conversion stage 60 and of a signal receiver 70 according to the described embodiment of the invention has been simulated by the Applicant and tested under noisy signal conditions. The results being obtained are indicated in FIGS. 8 and 9.

In particular, FIG. 8 shows the evolution of a signal on the output terminal OUT of the conversion stage 60, indicated with V(DIFSING), for a differential input on the terminals RXP and RXN with a noise overlapped to RXP being higher than the dynamics of the signal (and ideal RXN).

It can thus be seen how the reconstructed signal V(DIFSING) is correct, the noise having been correctly removed. The signal receiver 70 according to the described embodiment of the invention thus allows the signal on the output terminal TRIGGER of the Schmitt trigger 20, indicated with V(TRIG) in FIG. 8, to be optimally squared.

FIG. 9 shows the same signals with noise on both inputs RXP and RXN. It can be immediately noticed that the variable hysteresis receiver of digital signals 70 operates correctly even in this extreme condition.

In other words, the variable hysteresis receiver of digital signals 70 according to the described embodiment of the invention allows a differential noisy signal to be correctly reconstructed.

In conclusion, the conversion stage 60 and the hysteresis comparator 20 allow a receiver 70 of differential signals capable of operating correctly with noisy signals to be realized (even when noise exceeds the signal dynamics) and meanwhile they allow the following advantages to be achieved:

they allow the impedance to be adjusted with respect to the source (and/or cable), due to the resistive bridge (66) connected to the input terminals;

they allow the hysteresis voltage to be adjusted by changing the geometries of the transistors (M10, M11) comprised therein or by varying the bias current (Ipolar); the hysteresis voltage can thus be fitted to the specifications imposed by different standards;

they have a high response speed even for low bias currents operating in current modes (current mirrors have a low impedance=1/gm, being intrinsically fast);

they are stable when the bias current (Ipolar) varies due to the feedback lack; and they can be implemented in a low supply voltage technology.

Finally, advantageously according to embodiments of the invention, it is possible to realize a receiver of differential signals capable of operating at a high bit rate with a negligible power consumption, being thus suitable for portable battery applications.

Essentially, advantageously according to embodiments of the invention, the receiver provided can be integrated in low-cost CMOS technologies, with low supply voltage (traditionally <2.5V, but also 1.8V) and it has a high possible versatility of use.

Moreover, advantageously according to embodiments of the invention, the receiver provided is capable of supporting signals of the single-ended type (for consumer applications) or of the differential type (for professional applications).

Finally, the receiver provided supports a range of extremely variable voltages (for example, in the case of S/PDIF standards transmissions of digital data in the range 200 mV-7V are allowed), as well as signals affected by noises, for example mainly linked to the transmission means, being as much critical as the signal is low.

In conclusion, the receiver according to embodiments of the invention supports ALL-INPUT input signals without using external resistive dividers or level-shifters.

From the foregoing it will be appreciated that, although specific embodiments of the invention have been described herein for purposes of illustration, various modifications may be made without deviating from the spirit and scope of the invention.

The invention claimed is:

1. A signal receiver inserted between a first and a second voltage reference and having a first and a second input terminal effective to receive differential signals and an output terminal effective to provide a converted signal, wherein the signal receiver comprises a conversion stage inserted between said first and second voltage references and connected between said first and second input terminals of said signal receiver and an input terminal of a hysteresis comparator, connected to said output terminal of said signal receiver, said conversion stage performing a conversion from any input signal received on respective input terminals to an intermediate signal provided on an output terminal and suitable for reception by said hysteresis comparator;

wherein the conversion stage further comprises:
a first current mirror connected to said first voltage reference and to said input terminals, as well as to a bias terminal;
a second current mirror connected to said second voltage reference and to said first input terminal, as well as to a circuit node;
a third current mirror connected to said second voltage reference and to said second input terminal, as well as to said output terminal; and
a fourth current mirror connected to said first voltage reference, to said circuit node, as well as to said output terminal.

2. A signal receiver according to claim 1, wherein said conversion stage performs an ALL-INPUT/single-ended conversion generating a trapezoidal signal.

3. A signal receiver according to claim 2, wherein said conversion stage is further connected to a bias terminal effective to receive a bias current.

4. A signal receiver inserted between a first and a second voltage reference and having a first and a second input terminal effective to receive differential signals and an output terminal effective to provide a converted signal, wherein the signal receiver comprises a conversion stage inserted between said first and second voltage references and connected between said first and second input terminals of said signal receiver and an input terminal of a hysteresis comparator, connected in turn to said output terminal of said signal receiver, said conversion stage performing a conversion from any input signal received on respective input terminals to an intermediate signal provided on an output terminal and suitable for reception by said hysteresis comparator;

wherein said conversion stage performs an ALL-INPUT/single-ended conversion generating a trapezoidal signal;
wherein said conversion stage is further connected to a bias terminal effective to receive a bias current; and
wherein said conversion stage comprises:
a first current mirror connected to said first voltage reference and to said input terminals, as well as to said bias terminal;
a second current mirror connected to said second voltage reference and to said first input terminal, as well as to a circuit node;
a third current mirror connected to said second voltage reference and to said second input terminal, as well as to said output terminal; and
a fourth current mirror connected to said first voltage reference, to said circuit node, as well as to said output terminal.

5. A signal receiver according to claim 4, wherein said conversion signal further comprises a current-voltage converter, inserted between said first and second voltage references and connected to said output terminal.

6. A signal receiver according to claim 5, wherein said current-voltage converter comprises a tenth and an eleventh transistor being inserted between said first voltage reference and said output terminal of said conversion stage and having a control terminal connected to said output terminal of said conversion stage and said eleventh transistor being inserted between said output terminal and said second voltage reference and having a control terminal connected to said output terminal of said conversion stage.

7. A signal receiver according to claim 4, wherein said conversion stage further comprises a resistive bridge connected to said input terminals, as well as to said first, second and third current mirrors.

8. A signal receiver according to claim 7, wherein said resistive bridge comprises a first resistor connected to said first current mirror and, by means of a second resistor, to said first input terminal of said conversion stage, a third resistor connected to said first current mirror and, by means of a fourth resistor, to said second input terminal of said conversion stage, a fifth resistor connected to said second current mirror and, by means of said second resistor, to said first input terminal of said conversion stage, and a sixth resistor connected to said third current mirror and, by means of said fourth resistor, to said second input terminal of said conversion stage.

9. A signal receiver according to claim 8, wherein said resistive bridge further comprises a seventh resistor connected to said first and second input terminals of said conversion stage.

10. A signal receiver according to claim 4, wherein said first current mirror comprises a first, second and third transistor inserted, in parallel to each other, between said first voltage reference and said first input terminal of said conversion stage, said bias terminal and said second input terminal of said conversion stage respectively, and having control terminals connected to each other, said second transistor being diode-configured.

11. A signal receiver according to claim 4, wherein said second current mirror comprises a fourth and a fifth transistor inserted, in parallel to each other, between said second voltage reference and respectively said first input terminal of said conversion stage and said circuit node, and having control terminals connected to each other, said fourth transistor being diode-configured.

12. A signal receiver according to claim 4, wherein said third current mirror comprises a sixth and a seventh transistor inserted, in parallel to each other, between said second voltage reference and respectively said second input terminal and said output terminal of said conversion stage and having control terminals connected to each other, said sixth transistor being diode-configured.

13. A signal receiver according to claim 4, wherein said fourth current mirror comprises an eighth and a ninth transistor inserted, in parallel to each other, between said first voltage reference and respectively said circuit node and said output terminal of said conversion stage and having control terminals connected to each other, said eighth transistor being diode-configured.

14. A signal receiver according to claim 4, wherein said first, second, third, eighth, ninth and tenth transistors are P-channel MOS transistors and in that said fourth, fifth, sixth, seventh and eleventh transistors are N-channel MOS transistors.

15. A signal receiver according to claim 4, wherein it comprises respective first and second capacities inserted between said first and second input terminals of said conversion stage and said first and second input terminals of said signal receiver.

16. A signal receiver according to claim 4, wherein said hysteresis comparator is a Schmitt trigger.

17. A digital signal receiver, comprising:
a converter having first and second input terminals adapted to receive respective input signals and a bias input adapted to receive a bias current, the converter operable to develop an intermediate signal on an intermediate output in response to the input signals and the intermediate signal having a hysteresis that is a function of the bias current; and
a hysteresis comparator coupled to the intermediate output of the converter to receive the intermediate signal, and the hysteresis comparator operable to develop a trigger signal in response to the intermediate signal; and
wherein the converter further comprises a resistor bridge and a plurality of MOS transistors, the resistor bridge operable to reduce voltages of the input signals to levels appropriate for the MOS transistors and operable to match an input impedance of the digital signal receiver at the input terminals to an input impedance of a source applying the input signals.

18. The digital signal receiver of claim 17 wherein the intermediate signal generated by the converter comprises a trapezoidal signal independent of noise on the input signals.

19. The digital signal receiver of claim 17 wherein the converter comprises:
a first current mirror adapted to receive a first voltage reference and being coupled to the input terminals and coupled to the bias input;
a second current mirror adapted to receive a second voltage reference and being coupled to the first input terminal and coupled to an internal node;
a third current mirror adapted to receive the second voltage reference and being coupled to the second input terminal and coupled to the intermediate output; and
a fourth current mirror adapted to receive the first voltage reference and being coupled to the internal node and to the intermediate output.

20. The digital signal receiver of claim 19 wherein the converter further comprises a current-to-voltage converter coupled to the third and fourth current mirrors and operable to develop the intermediate signal responsive to third and fourth currents received from the third and fourth current mirrors, respectively.

21. The digital signal receiver of claim 20 wherein the current-to-voltage converter comprises two diode-coupled transistors having characteristics that may be varied to adjust the hysteresis of the converter.

22. An integrated circuit, comprising:
a digital signal receiver, including,
a converter having first and second input terminals adapted to receive respective input signals and a bias input adapted to receive a bias current, the converter operable to develop an intermediate signal on an intermediate output in response to the input signals and the intermediate signal having a hysteresis that is a function of the bias current; and
a hysteresis comparator coupled to the intermediate output of the converter to receive the intermediate signal, and the hysteresis comparator operable to develop a trigger signal in response to the intermediate signal; and
wherein the converter further comprises a resistor bridge and a plurality of MOS transistors, the resistor bridge operable to reduce voltages of the input signals to levels appropriate for the MOS transistors and operable to match an input impedance of the digital signal receiver at the input terminals to an input impedance of a source applying the input signals.

23. The integrated circuit of claim 22 wherein the integrated circuit comprises a digital signal processor operable to process the trigger signal from the digital signal receiver.

24. An electronic system, comprising:
an integrated circuit including a digital signal receiver, the digital signal receiver including,
a converter having first and second input terminals adapted to receive respective input signals and a bias input adapted to receive a bias current, the converter operable to develop an intermediate signal on an intermediate output in response to the input signals and the intermediate signal having a hysteresis that is a function of the bias current; and
a hysteresis comparator coupled to the intermediate output of the converter to receive the intermediate signal, and the hysteresis comparator operable to develop a trigger signal in response to the intermediate signal; and
wherein the converter further comprises a resistor bridge and a plurality of MOS transistors, the resistor bridge operable to reduce voltages of the input signals to levels appropriate for the MOS transistors and operable to match an input impedance of the digital signal receiver at the input terminals to an input impedance of a source applying the input signals.

25. The electronic system of claim 24 wherein the electronic system comprises a computer system.

26. A signal receiver inserted between a first and a second voltage reference and having a first and a second input terminal effective to receive differential signals and an output terminal effective to provide a converted signal, the signal receiver comprising:
a hysteresis comparator including an input terminal, the hysteresis comparator being connected to said output terminal of said signal receiver;
a conversion stage inserted between said first and second voltage references and connected between said first and second input terminals of said signal receiver and the input terminal of the hysteresis comparator, connected in turn to said output terminal of said signal receiver, said conversion stage performing a conversion from any input signal received on respective input terminals to an intermediate signal provided on an output terminal and suitable for reception by said hysteresis comparator;
wherein said conversion stage comprises:
a first current mirror connected to said first voltage reference and to said input terminals, as well as to said bias terminal;
a second current mirror connected to said second voltage reference and to said first input terminal, as well as to a circuit node;
a third current mirror connected to said second voltage reference and to said second input terminal, as well as to said output terminal; and
a fourth current mirror connected to said first voltage reference, to said circuit node, as well as to said output terminal;
wherein the second and third current mirrors are coupled to the first and second input terminals, respectively, through a resistor bridge operable to reduce voltages of the input signals to appropriate for a plurality of MOS transistors and operable to match an input impedance of the digital signal receiver at the input terminals to an input impedance of a source applying the input signals.

* * * * *

UNITED STATES PATENT AND TRADEMARK OFFICE
CERTIFICATE OF CORRECTION

PATENT NO.       : 7,583,122 B2                          Page 1 of 1
APPLICATION NO.  : 10/749127
DATED            : September 1, 2009
INVENTOR(S)      : Ronchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1543 days.

Signed and Sealed this

Fourteenth Day of September, 2010

David J. Kappos
*Director of the United States Patent and Trademark Office*